(12) United States Patent
Lee

(10) Patent No.: US 7,021,320 B2
(45) Date of Patent: Apr. 4, 2006

(54) METHOD OF REMOVING A VIA FENCE

(75) Inventor: Chou-Feng Lee, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 239 days.

(21) Appl. No.: 10/411,799

(22) Filed: Apr. 11, 2003

(65) Prior Publication Data

US 2004/0200803 A1 Oct. 14, 2004

(51) Int. Cl.
*H01L 21/302* (2006.01)

(52) U.S. Cl. .................. 134/1.3; 438/687; 438/725; 438/704; 438/710; 438/745

(58) Field of Classification Search ............ 134/1.3; 216/57, 67; 438/704, 710, 745, 725, 687
See application file for complete search history.

(56) References Cited

U.S. PATENT DOCUMENTS

| 5,989,997 A | * | 11/1999 | Lin et al. .................... 438/622 |
| 6,274,483 B1 | | 8/2001 | Chang et al. ............... 438/640 |
| 6,329,118 B1 | * | 12/2001 | Hussein et al. .......... 430/270.1 |
| 6,399,483 B1 | | 6/2002 | Liu et al. |
| 6,399,552 B1 | * | 6/2002 | Lee et al. .................... 510/175 |
| 6,417,096 B1 | * | 7/2002 | Chen et al. ................. 438/637 |
| 6,426,298 B1 | | 7/2002 | Chen et al. ................. 438/699 |
| 6,429,119 B1 | | 8/2002 | Chao et al. ................. 438/633 |
| 6,589,881 B1 | * | 7/2003 | Huang et al. ............... 438/725 |

FOREIGN PATENT DOCUMENTS

JP 63-113456 * 5/1988

OTHER PUBLICATIONS

Lassig et al, "Selective Removal Strategies for Low k Dual Damascene", Semiconductor Fabtech, pp. 185–190, undated.

Singer, Peter, Ed–in–Chief, "Dual–Damascene Challenges Dielectric Etch", www.e–insite.net/semiconductor/index.asp?layout=article&articleid=CA165320, 6 pages, Jan. 6, 2003.

Triana, Greg, "Copper Intergration", ECE 6450, 15 pages, Nov. 6, 2002.

* cited by examiner

*Primary Examiner*—George A. Goudreau
(74) *Attorney, Agent, or Firm*—Duane Morris, LLP; Steven E. Koffs

(57) ABSTRACT

A method of fabricating a dual damascene structure includes etching a via through a first dielectric layer above a substrate, a barrier layer on the first dielectric layer, and a second dielectric layer on the barrier layer. The via is at least partially filled with a photoresist plug. The plug is etched back. A trench is etched through the second dielectric layer. The trench is aligned with the via. The substrate having the first and second dielectric layers thereon is wet with an acid for a sufficient length of time to remove a via fence formed in the trench. The via and the trench are filled with metal.

13 Claims, 3 Drawing Sheets

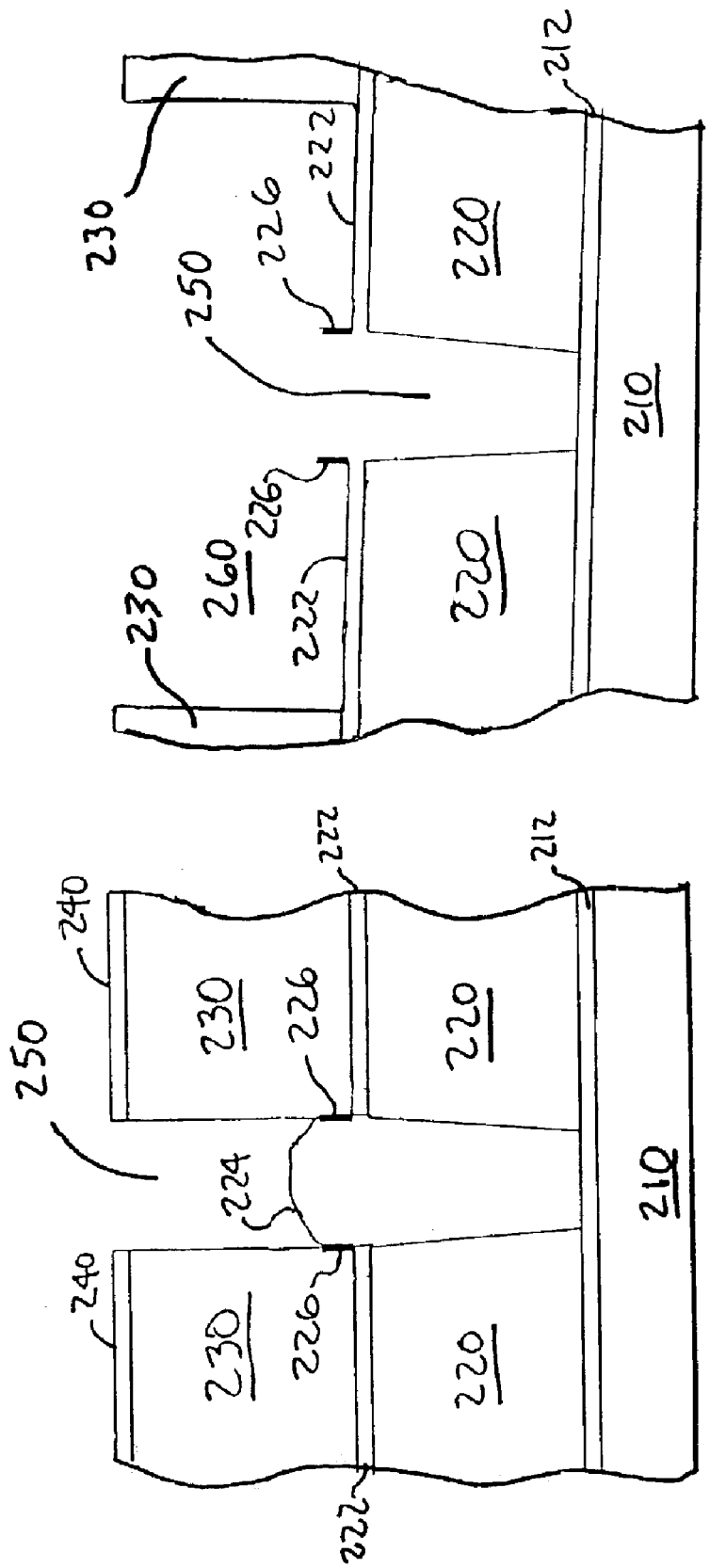

METHOD OF REMOVING A VIA FENCE

FIELD OF THE INVENTION

The present invention relates to integrated circuit fabrication generally, and more specifically to dual damascene methods.

BACKGROUND

The advances of semiconductor manufacturing technology lead to continuous increase in the operating speed and decrease in the size of integrated circuits. An integrated circuit, comprising many electronic components such as transistors and capacitors, is typically formed by multiple levels with interconnects. Patterned conductive material on one level is electrically insulated from patterned conductive material on another level by an insulating layer made of dielectric material. Each level may include lines and patterns of various shapes and sizes. Different levels are vertically integrated and electrically connected with each other by structures often referred to as vias.

To increase the operating speed of integrated circuits while reducing power consumption, conductive material with a lower electrical resistance, such as copper, is used. However, copper is difficult to etch in a semiconductor environment. As a result, a damascene approach is used, which comprises etching trenches and vias in the insulating layer and subsequently filling the trenches and vias with conductive material, such as copper. Then the conductive material is polished down to the surface of the insulating layer by, for example, chemical mechanical polishing (CMP) to form the desired metal pattern. The damascene process is advantageous because: (1) it is easier to control the dimensions and registration of etched lines in the dielectric material than controlling the etching of lines in copper, and (2) it is easier to make a planar surface by polishing the copper than by planarizing the dielectric.

In a typical via-first sequence, a mask is used to etch a via through two layers of dielectric between conductor layers. Then a trench that is wider than the via is etched through the top one of the two layers. To prevent the trench-etching step from etching through the underlying etch stop (e.g., nitride) layer and eroding the conductive line beneath the via, a photoresist plug is inserted in the via before the trench is etched. The trench mask is aligned with the via and the trench is etched.

However, the introduction of the via plug creates a problem, which has been observed in 0.13 µm copper technology fabrication. If the photoresist plug is too low, a via facet occurs. The facet is a widening of the via at the top of the lower one of the two dielectric layers, caused by erosion of the via wall near the top of the lower layer. The facet is unacceptable, because, for example, it causes poor deposition of the TaN barrier layer and copper film in the trench. The facet problem can be improved by reducing the photoresist plug etch-back over-etch time. However, reducing the etch-back time can lead to a different problem: the via fence (or veil). The via fence consists of a ring of material projecting upwards out of the via above the lower dielectric layer. The fence defect is also unacceptable, because it also causes poor deposition of the TaN barrier layer and copper film in the trench.

Attempting to avoid formation of facets and fences has resulted in a very narrow plug etch-back window.

SUMMARY OF THE INVENTION

In a damascene process of fabricating an interconnect structure in an integrated circuit, a method for removing a via fence comprises the step of wetting the interconnect structure with an acid for a sufficient length of time to remove the via fence.

BRIEF DESCRIPTION OF THE DRAWINGS

FIGS. 2A and 2B show two steps in a damascene process for fabrication of an interconnect, resulting in formation of a via fence.

DETAILED DESCRIPTION

Figure 1:
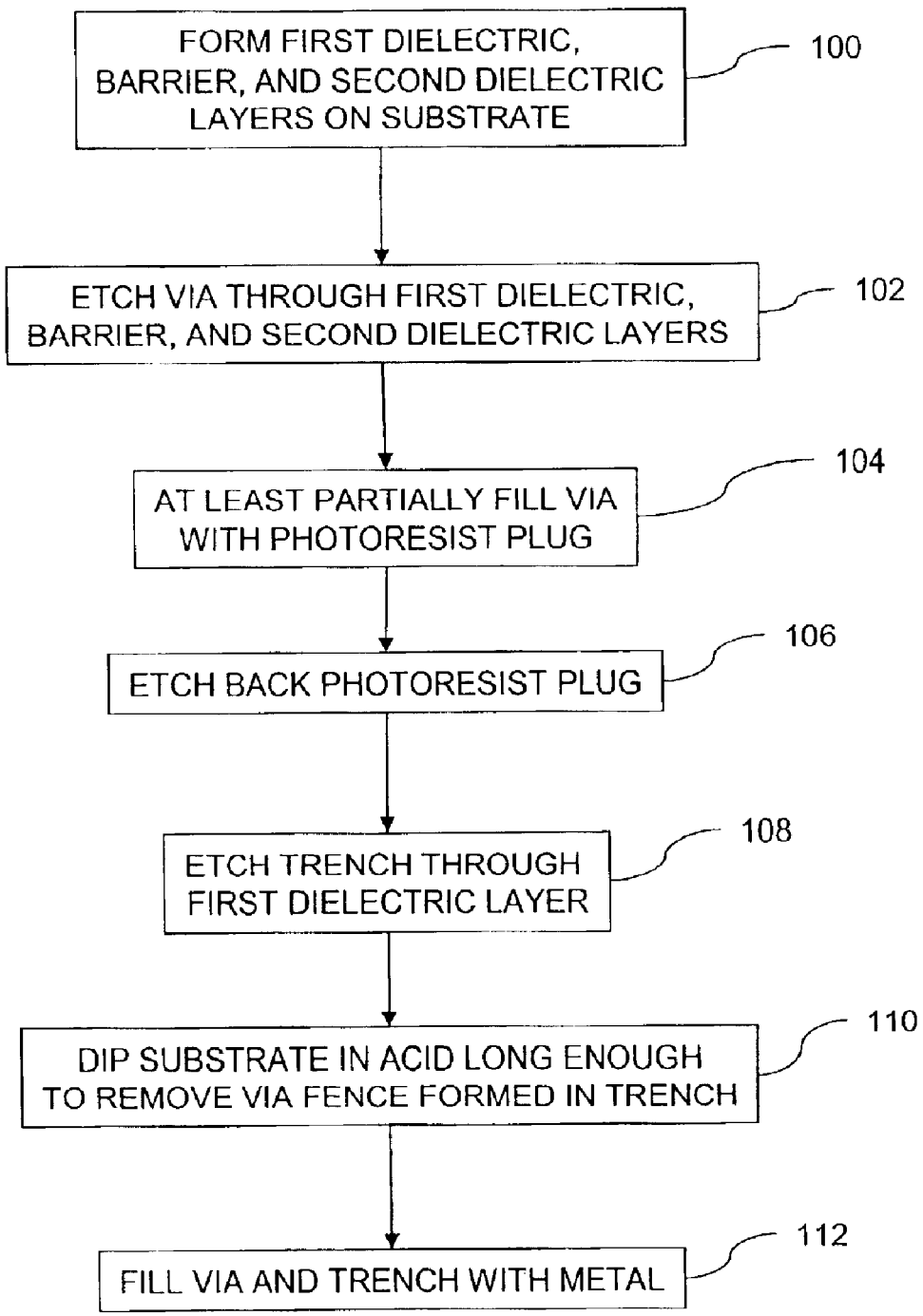
FIG. 1 is flow chart diagram of an exemplary method for removing a via fence.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

FIG. 1 is a flow chart diagram of exemplary method of fabricating a dual damascene structure. Such a method may be used in such technologies as 0.13 µm copper, for example, but the method is not limited thereto, and may be used with other damascene technologies and geometries.

FIGS. 2A and 2B show an exemplary interconnect structure, which is referenced in the explanation of the method of FIG. 1.

Referring again to FIG. 1, at step 100, a first dielectric layer 220, a barrier layer 222 and a second dielectric layer 230 are formed above a substrate 210 having a lower wiring layer thereon. The term substrate as used herein may refer to a bare substrate or a substrate having one or more metal and/or intermetal dielectric (IMD) layers thereon. The substrate 210 may be, for example, a silicon substrate having an I-line high transmittance glass dielectric layer offering both high UV-transmittance and high refractive index homogeneity, with a conductive line thereon.

An etch stop layer 212 protects the conductive line on the substrate 210 from erosion during the via and trench etching processes. Similarly the etch stop layer 222 protects the first dielectric layer from erosion during the trench etching process. The etch stop layers 212 and 222 may be, for example, 500 Å silicon nitride layers. Other refractory insulating materials with insulating properties may be used. Other materials that may be used for the etch stop layers 212 and 222 include, but are not limited to: $Si_3N_4$, $Si_xN_y$, and $Si_xON_y$.

The first and second dielectric layers 220 and 230, respectively, may be, for example, an insulating material or materials such as undoped silicate glass (USG), or $SiO_x$ deposited by chemical vapor deposition (CVD).

An anti-reflection layer (ARL) is used to form a layer 240 over the second dielectric layer. The ARL 240 prevents the glistening of the surface from interfering with the accuracy of subsequent photoresist exposure. The anti-reflective layer may be, for example, a 600 Å layer of silicon oxynitride (SiON). A photoresist mask layer (not shown) having openings corresponding to the vias is formed over the ARL 240.

At step 102, a via 250 is etched through the first dielectric layer 220, the barrier layer 222, and the second dielectric layer 230. This etching can be performed using a dry etching technique, for example. The depth of the etching is limited by the etch stop layer 212.

At step 104, the via is at least partially filled with a photoresist plug 224, to protect the layers 212, 220 and 222 during the subsequent trench etching step. The photoresist plug 224 allows the trench etch process to be non-selective with respect to the barrier layer 222. The photoresist plug 224 may be the same material as the ARL, for example, SiON. Other deep ultra violet (DUV) photoresist materials may be used.

At step 106, the plug 224 is etched back to the desired height, so that the subsequent trench etch step can etch the second dielectric layer 230 down to the barrier layer 222 without forming a via facet. In one example, the plug has a height of about 1200 Å.

In the example, a plug etch-back over etch time between about 100 seconds and about 185 seconds can be used. One of ordinary skill in the art will understand that this etch-back time window is expanded to encompass substantially lower times than were used in the prior art.

For example, the exemplary method allows a window between 100 seconds and about 155 seconds to be used. This window of times was previously unavailable. Using the lower plug etch-back time, the probability of a via facet is minimized, while the probability of fence formation is increased. However, the exemplary process accommodates the increased likelihood of fence formation, as explained further below.

At step 108, a trench 260 is etched through the second dielectric layer 230. The trench 260 is aligned with the via 250. The trench etching step may be performed by reactive ion etch (RIE), for example. Following the formation of the trench 260, there is a substantial probability that a via fence 226 is formed, particularly if the etch back time is about 150 seconds or less. Without being bound by any theory, the inventors believe the fence 226 is made of an organic chemical material formed by a chemical compound of photoresist material and oxide material.

At step 110, following the trench etching step, the substrate 210 with the first and second dielectric layers 220 and 230 thereon is wet with an acid for a sufficient length of time to remove a via fence 226 formed in the trench 260. In some embodiments, the substrate is wetted by dipping the substrate in the acid. Dipping provides good control over the length of time the substrate is exposed to the acid. Following the desired dipping time, the substrate is removed from the acid and any acid remaining on the substrate is washed off with de-ionized water.

In one example, an acid mixture comprising hydrogen fluoride (HF) is used. Additional constituents may be included in the acid mixture in sufficient quantities to prevent an excessive etch rate. These additional constituents may include, for example, sufficient quanitities of buffered oxide etch (BOE) solution, acetic acid ($CH_3COOH$) and de-ionized water to prevent an excessive etch rate. The BOE solution may contain, 40% Ammonium Flouride ($NH_4F$) and 49% HF in a ratio between about 4:1 and about 100:1 (resulting in HF concentration between 10% and 0.45%, respectively).

In one exemplary embodiment, the ratio of HF, BOE, $CH_3COOH$ and deionized water in the acid is 1:14:10:3. Fence removal time is rapid. In one example, the length of time is approximately 1.5 seconds. One of ordinary skill in the art understands that the best method to determine the appropriate acid solution strength for any selected dipping time is to test that acid solution in a laboratory. The shorter the selected dipping time, the stronger the acid solution will be. Conversely, the longer the selected dipping time, the weaker the acid solution will be. The acid recipe can then be fine tuned when released to the production environment, to make sure that the removal rate is not too fast. In alternative embodiments, the acid mixture composition may be selected, and an appropriate dipping time can be determined corresponding to that acid mixture.

Figure 3B:
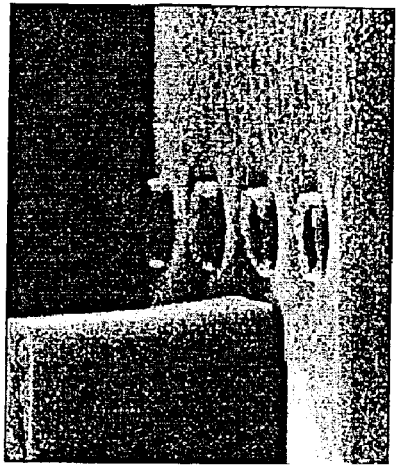
FIG. 3B shows via fences after 0.5 seconds exposure to an acid mixture.
Figure 3D:
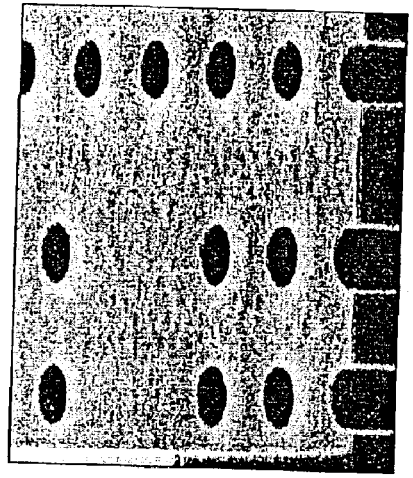
FIG. 3D shows via fences after 1.5 seconds exposure to the acid mixture.
Figure 3A:
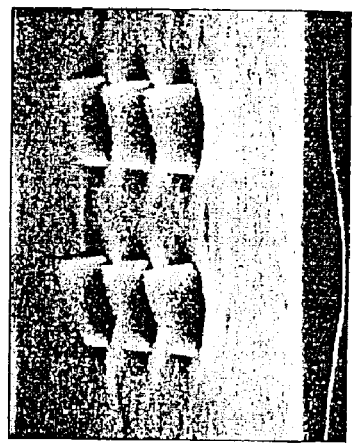
FIG. 3A is a scanning electron microscope (SEM) micrograph of a plurality of vias having fences thereon.
Figure 3C:
FIG. 3C shows via fences after 1.0 seconds exposure to the acid mixture.

FIGS. 3A–3D are SEM micrographs showing a plurality of via fences before, during, and after the acid treatment. FIG. 3A shows the plurality of vias having fences thereon, before acid treatment. FIG. 3B shows via fences after 0.5 seconds exposure to an acid mixture. FIG. 3C shows via fences after 1.0 seconds exposure to the acid mixture. FIG. 3D shows via fences after 1.5 seconds exposure to the acid mixture.

Following completion of the acid dip, any fence material 226 in the trench is substantially removed.

At step 112, a seed layer such as TaN is applied, and the via 250 and the trench 260 are filled with metal. Because the fence is eliminated, good TaN and copper deposition are achieved, and a more stable yield is achieved. Good critical dimensions (CD) are observed in the after-etch inspection of the vias.

Because the acid dipping step substantially removes any fence material 226, the plug etch back time can be reduced to a time, such that the probability of facet formation is substantially eliminated, even though there is a high probability of fence formation. For example, a plug etch back time of about 130 seconds may be used.

As one of ordinary skill in the art understands, the fence and facet defects occurred on interconnect layers. So application of the technique described above is not limited to the top layer only. Rather, the techniques described above can be applied at any interconnect layers where an interconnect including a trench and a via is formed.

Although an exemplary plug etch back time of 100 to 150 seconds is described, it is contemplated that the above described methods can be used in a variety of other geometries and with different technologies, in which case an adjustment to the etch back time window is made. For a given technology, a sufficiently short etch back window is selected, so that there is very little chance of via faceting occurring, even though there is an increased probability of fence formation. Then after the plug etch back, the substrate having the interconnect structure is wet with an acid solution to remove the fence.

Although the exemplary embodiment described above uses dipping to wet the substrate with the acid, in other embodiments, other wetting methods may be used. For example, in some embodiments, the substrate is wetted by washing the substrate in the acid (i.e., putting the substrate into a container and adding the acid). At the end of the washing time, either the substrate is removed from the acid, or the acid is quickly drained or poured out of the container. In other embodiments, the substrate is sprayed with the acid.

Following the desired spraying time, the substrate is either sprayed with de-ionized water or dipped or washed in de-ionized water.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. In a damascene process of fabricating an interconnect structure in an integrated circuit, a method for removing a via fence, comprising the steps of:

etching back a plug in the interconnect structure using a plug etch back time that is short enough to substantially eliminate a probability of forming a via facet, while providing a high probability of forming a via fence; and wetting the interconnect structure with an acid for a sufficient length of time to remove the via fence.

2. The method of claim 1, wherein the acid includes HF.

3. The method of claim 2, wherein the acid further includes BOE, $CH_3COOH$ and deionized water.

4. The method of claim 3, wherein the ratio of HF, BOE, $CH_3COOH$ and deionized water in the acid is 1:14:10:3.

5. The method of claim 3, wherein the length of time is approximately 1.5 seconds.

6. The method of claim 1, further comprising removing a photoresist plug from the interconnect structure using a plug etch back over etch time between about 100 seconds and about 155 seconds.

7. A method of fabricating a dual damascene structure, comprising the steps of:

(a): etching a via through a first dielectric layer above a substrate, a barrier layer on the first dielectric layer, and a second dielectric layer on the barrier layer;

(b): at least partialy filling the via with a photoresist plug;

(c): etching back the plug using a plug etch back time that is short enough to substantially eliminate a probability of forming a via facet, while providing a high probability of forming a via fence;

(d): etching a trench through the second dielectric layer, the trench aligned with the via;

(e): wetting the substrate having the first and second dielectric layers thereon with an acid for a sufficient length of time to remove the via fence formed in the trench; and (f): filling the via and the trench with metal.

8. The method of claim 7, wherein the acid includes HF.

9. The method of claim 8, wherein the acid further includes sufficient BOE, $CH_3COOH$ and deionized water to prevent an excessive etch rate.

10. The method of claim 9, wherein the ratio of HF, BOE, $CH_3COOH$ and deionized water in the acid is 1:14:10:3.

11. The method of claim 8, wherein the length of time is approximately 1.5 seconds.

12. The method of claim 8, step (c): uses a plug etch-back over etch time between about 100 seconds and about 155 seconds.

13. The method of claim 8, wherein the plug has a height of about 1200 Å.

* * * * *